US012652857B2

(12) United States Patent
Zhao et al.

(10) Patent No.: US 12,652,857 B2
(45) Date of Patent: Jun. 9, 2026

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Huihui Zhao, Wuhan (CN); Changbum Park, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 878 days.

(21) Appl. No.: 17/278,262

(22) PCT Filed: Nov. 27, 2020

(86) PCT No.: PCT/CN2020/132326
§ 371 (c)(1),
(2) Date: Jul. 17, 2023

(87) PCT Pub. No.: WO2022/088365
PCT Pub. Date: May 5, 2022

(65) Prior Publication Data
US 2023/0387134 A1      Nov. 30, 2023

(30) Foreign Application Priority Data
Oct. 30, 2020      (CN) ......................... 202011191786.1

(51) Int. Cl.
*H01L 27/12*      (2006.01)
*H10D 86/01*      (2025.01)
(Continued)

(52) U.S. Cl.
CPC ......... *H10D 86/60* (2025.01); *H10D 86/0221* (2025.01); *H10D 86/423* (2025.01)

(58) Field of Classification Search
CPC .... H10D 86/60; H10D 86/0221; H10D 86/01; H10D 86/423; H10D 86/40;
(Continued)

(56) References Cited

U.S. PATENT DOCUMENTS 11,532,686 B2 * 12/2022 Lu ......................... H10D 86/423
11,699,710 B2 * 7/2023 Cai ....................... H10D 86/423
257/43

(Continued)

FOREIGN PATENT DOCUMENTS

CN      101071816 A      11/2007
CN      104392991 A      3/2015
(Continued)

OTHER PUBLICATIONS

International Search Report in International application No. PCT/CN2020/132326, mailed on Jul. 26, 2021.
(Continued)

*Primary Examiner* — Nikolay K Yushin
(74) *Attorney, Agent, or Firm* — PV IP PC; Peter Stecher; Wei Te Chung

(57) ABSTRACT

A display panel and a manufacturing method thereof are provided. The manufacturing method of the display panel includes: forming a first contact hole penetrating at least a portion of a second film layer group and a first via hole penetrating the second film layer group by same first patterning process and forming a second contact hole penetrating a first film layer group and at least a portion of the second film layer group and a second via hole penetrating the (Continued)

second film layer group by same second patterning process. Therefore, at least two patterning processes can be eliminated.

18 Claims, 5 Drawing Sheets

(51) Int. Cl.
   *H10D 86/40* (2025.01)
   *H10D 86/60* (2025.01)
(58) Field of Classification Search
   CPC ............... H10D 86/451; H10D 86/021; H10D 86/0231; H10D 86/441; H10K 71/231; H10K 71/20; H10K 71/00; H10K 71/50
   See application file for complete search history.

(56) References Cited

U.S. PATENT DOCUMENTS

| | | | |
|---|---|---|---|
| 2008/0297711 A1 | 12/2008 | Kawasaki | |
| 2021/0249449 A1* | 8/2021 | Cai | H10D 86/451 |
| 2021/0359063 A1* | 11/2021 | Lu | H10D 86/481 |

FOREIGN PATENT DOCUMENTS

| | | | |
|---|---|---|---|
| CN | 107818991 A | 3/2018 |
| CN | 108231671 A | 6/2018 |
| CN | 108288621 A | 7/2018 |
| CN | 108376672 A | 8/2018 |
| CN | 108493198 A | 9/2018 |
| CN | 109326611 A | 2/2019 |
| CN | 109326633 A | 2/2019 |
| CN | 109920845 A | 6/2019 |
| CN | 110289269 A | 9/2019 |
| CN | 110581154 A | 12/2019 |

OTHER PUBLICATIONS

Written Opinion of the International Search Authority in International application No. PCT/CN2020/132326, mailed on Jul. 26, 2021.
Chinese Office Action issued in corresponding Chinese Patent Application No. 202011191786.1 dated May 30, 2022, pp. 1-10.

* cited by examiner

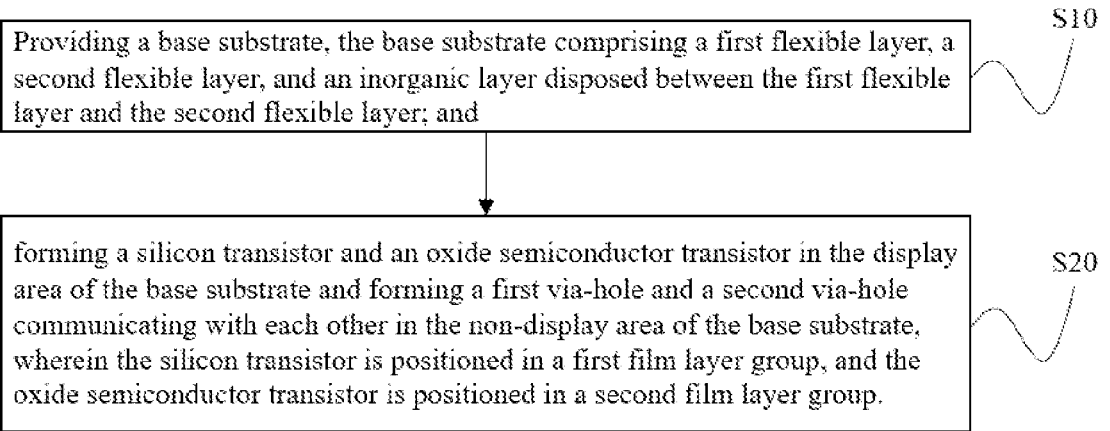

S10

Providing a base substrate, the base substrate comprising a first flexible layer, a second flexible layer, and an inorganic layer disposed between the first flexible layer and the second flexible layer; and

S20 forming a silicon transistor and an oxide semiconductor transistor in the display area of the base substrate and forming a first via-hole and a second via-hole communicating with each other in the non-display area of the base substrate, wherein the silicon transistor is positioned in a first film layer group, and the oxide semiconductor transistor is positioned in a second film layer group.

FIG. 1

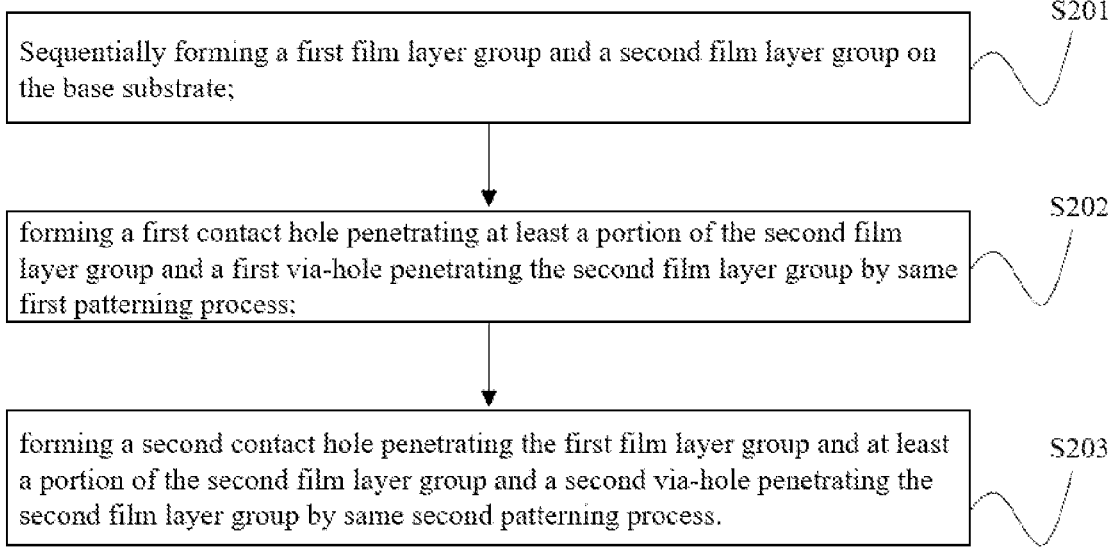

S201

Sequentially forming a first film layer group and a second film layer group on the base substrate;

S202 forming a first contact hole penetrating at least a portion of the second film layer group and a first via-hole penetrating the second film layer group by same first patterning process;

S203 forming a second contact hole penetrating the first film layer group and at least a portion of the second film layer group and a second via-hole penetrating the second film layer group by same second patterning process.

FIG. 2

DISPLAY PANEL AND MANUFACTURING METHOD THEREOF

RELATED APPLICATIONS

This application is a Notional Phase of PCT Patent Application No. PCT/CN2020/132326 having international filing date of Nov. 27, 2020, which claims the benefit of priority of Chinese Patent Application Nos. 202011191786.1 filed on Oct. 30, 2020. The contents of the above applications are all incorporated by reference as if fully set forth herein in their entirety.

FIELD OF INVENTION

The invention relates to the field of display technology, in particular to a display panel and a manufacturing method thereof.

BACKGROUND OF INVENTION

As display technology continues to advance, people have higher requirements for the resolution, power consumption, and image quality of display products. Low-temperature polycrystalline oxide (LTPO) technology has gradually become a main development direction of future display substrates. Due to the high mobility of silicon transistors, it accelerates the charging speed of pixel capacitors. Metal oxide semiconductor transistors have lower leakage current. This technology combines the advantages of silicon transistors and metal oxide semiconductor transistors and contributes to the development of high-resolution, low-power consumption, and high-definition display products. Compared with the manufacture of low-temperature polysilicon display panels, more film layers need to be formed in the manufacture of LTPO display panels. After the silicon transistors are formed, metal oxide (IGZO) is deposited on the silicon transistors by a sputtering process to form oxide semiconductor transistors.

The manufacturing process of the LTPO display panel requires at least 16 patterning (lithography) processes. Due to the complicated manufacturing process, the yield is low and the cost is high. In this manufacturing process, the source and drain of the silicon transistor and the active layer, and the source and drain of the oxide semiconductor transistor and the active layer are connected through via holes. This requires two separate patterning processes for digging. In addition, the first via hole and the second via hole positioned in the non-display area also need to be dug separately by two patterning processes. Therefore, the current process requires four patterning processes for digging holes, which is complicated and costly, and each process may cause yield loss.

As mentioned above, it is necessary to provide a new display panel and a manufacturing method thereof to solve the above-mentioned technical problems.

The display panel and the manufacturing method thereof provided by the present invention solve the technical problems of low yield and high cost in the prior art associated with the complicated manufacturing process of the LTPO display panel.

SUMMARY OF INVENTION

To solve the above problems, the technical solution provided by the present invention is as follows:

The embodiment of the present invention provides a manufacturing method of a display panel, the display panel includes a display area and a non-display area surrounding the display area, the manufacturing method of the display panel includes following steps:

step S10, providing a base substrate, the base substrate comprising a first flexible layer, a second flexible layer, and an inorganic layer disposed between the first flexible layer and the second flexible layer; and step S20, forming a silicon transistor and an oxide semiconductor transistor in the display area of the base substrate and forming a first via hole and a second via hole communicating with each other in the non-display area of the base substrate, wherein the silicon transistor is positioned in a first film layer group, and the oxide semiconductor transistor is positioned in a second film layer group; and wherein the step S20 includes following steps: step S201: sequentially forming the first film layer group and the second film layer group on the base substrate; and step S202: forming a first contact hole penetrating at least a portion of the second film layer group and the first via hole penetrating the second film layer group by same first patterning process.

According to the manufacturing method of the display panel provided by the embodiment of the present invention, the step S20 further includes following steps: step S203: forming a second contact hole penetrating the first film layer group and at least a portion of the second film layer group and the second via hole penetrating the second film layer group by same second patterning process.

According to the manufacturing method of the display panel provided by the embodiment of the present invention, the step S201 includes following steps: sequentially forming a barrier layer and a buffer layer on the base substrate; sequentially forming a first active layer, a first gate insulating layer, a first gate layer, a second gate insulating layer, a second gate layer, and a first interlayer dielectric of the silicon transistor on the buffer layer to obtain the first film layer group; and sequentially forming a second active layer, a third gate insulating layer, a third gate layer, and a second interlayer dielectric layer of the oxide semiconductor transistor on the first interlayer dielectric layer to obtain the second film group; wherein the first contact hole and the first via hole formed by the same first patterning process penetrate the second interlayer dielectric layer and the third gate insulating layer; the second contact hole formed by the same second patterning process penetrates the second interlayer dielectric layer, the third gate insulating layer, the first interlayer dielectric layer, the second gate insulating layer, the first gate insulating layer, and the buffer layer; and the second via hole formed by the same second patterning process penetrates the first interlayer dielectric layer, the second gate insulating layer, the first gate insulating layer, the buffer layer, and the barrier layer.

According to the manufacturing method of the display panel provided by the embodiment of the present invention, forming the first contact hole and the first via hole by the same first patterning process includes following steps: forming a first photoresist layer on the second interlayer dielectric layer; sequentially performing exposure, development, and etching on the first photoresist layer to obtain the first contact hole and the first via hole penetrating the second interlayer dielectric layer and the third gate insulating layer; and stripping off a remaining portion of the first photoresist layer.

According to the manufacturing method of the display panel provided by the embodiment of the present invention, forming the second contact hole and the second via hole by the same second patterning process includes following steps: forming a second photoresist layer on the second interlayer dielectric layer and an inner sidewall of the first via hole; sequentially performing exposure, development, and etching on the second photoresist layer to obtain the second contact hole penetrating the second interlayer dielectric layer, the third gate insulating layer, the first interlayer dielectric layer, the second gate insulating layer, the first gate insulating layer, and the buffer layer, and the second via hole penetrating the first interlayer dielectric layer, the second gate insulating layer, the first gate insulating layer, the buffer layer, and the barrier layer; and stripping off a remaining portion of the second photoresist layer.

According to the manufacturing method of the display panel provided by the embodiment of the present invention, after forming the second contact hole and the second via hole by the same second patterning process, the step S20 further includes: forming a first source and drain metal layer on the second interlayer dielectric layer, wherein the first source and drain metal layer is connected to the second active layer through the first contact hole, and the first source and drain metal layer is connected to the first active layer through the second contact hole.

According to the manufacturing method of the display panel provided by the embodiment of the present invention, after forming the first source and drain metal layer on the second interlayer dielectric layer, the manufacturing method further includes following steps: sequentially forming a passivation layer, a first planarization layer, and the second source and drain metal layer on the first source and drain metal layer, wherein the first planarization layer fills the first via hole and the second via hole, a third contact hole is formed on the first planarization layer, the second source and drain metal layer is connected to the first source and drain metal layer through the third contact hole; and sequentially forming a second planarization layer, an anode, a pixel defining layer, a light-emitting layer, and spacers on the second source and drain metal layer, a fourth contact hole is formed on the second planarization layer, and the anode is connected to the second source and drain metal layer through the fourth contact hole.

The embodiment of the present invention provides a manufacturing method of a display panel, the display panel includes a display area and a non-display area surrounding the display area, the manufacturing method of the display panel includes following steps: step S10, providing a base substrate; and step S20, forming a silicon transistor and an oxide semiconductor transistor on the base substrate and forming a first via hole and a second via hole communicating with each other in the non-display area, wherein the silicon transistor is positioned in a first film layer group, and the oxide semiconductor transistor is positioned in a second film layer group; and wherein the step S20 includes following steps: step S201: sequentially forming the first film layer group and the second film layer group on the base substrate; and step S202: forming a first contact hole penetrating at least a portion of the second film layer group and the first via hole penetrating the second film layer group by same first patterning process.

According to the manufacturing method of the display panel provided by the embodiment of the present invention, the step S20 further includes following steps: step S203: forming a second contact hole penetrating the first film layer group and at least a portion of the second film layer group and the second via hole penetrating the second film layer group by same second patterning process.

According to the manufacturing method of the display panel provided by the embodiment of the present invention, the step S201 includes following steps: sequentially forming a barrier layer and a buffer layer on the base substrate; sequentially forming a first active layer, a first gate insulating layer, a first gate layer, a second gate insulating layer, a second gate layer, and a first interlayer dielectric of the silicon transistor on the buffer layer to obtain the first film layer group; and sequentially forming a second active layer, a third gate insulating layer, a third gate layer, and a second interlayer dielectric layer of the oxide semiconductor transistor on the first interlayer dielectric layer to obtain the second film group; wherein the first contact hole and the first via hole formed by the same first patterning process penetrate the second interlayer dielectric layer and the third gate insulating layer; the second contact hole formed by the same second patterning process penetrates the second interlayer dielectric layer, the third gate insulating layer, the first interlayer dielectric layer, the second gate insulating layer, the first gate insulating layer, and the buffer layer; and the second via hole formed by the same second patterning process penetrates the first interlayer dielectric layer, the second gate insulating layer, the first gate insulating layer, the buffer layer, and the barrier layer.

According to the manufacturing method of the display panel provided by the embodiment of the present invention, forming the first contact hole and the first via hole by the same first patterning process includes following steps: forming a first photoresist layer on the second interlayer dielectric layer; sequentially performing exposure, development, and etching on the first photoresist layer to obtain the first contact hole and the first via hole penetrating the second interlayer dielectric layer and the third gate insulating layer; and stripping off a remaining portion of the first photoresist layer.

According to the manufacturing method of the display panel provided by the embodiment of the present invention, forming the second contact hole and the second via hole by the same second patterning process includes following steps: forming a second photoresist layer on the second interlayer dielectric layer and an inner sidewall of the first via hole; sequentially performing exposure, development, and etching on the second photoresist layer to obtain the second contact hole penetrating the second interlayer dielectric layer, the third gate insulating layer, the first interlayer dielectric layer, the second gate insulating layer, the first gate insulating layer, and the buffer layer, and the second via hole penetrating the first interlayer dielectric layer, the second gate insulating layer, the first gate insulating layer, the buffer layer, and the barrier layer; and stripping off a remaining portion of the second photoresist layer.

According to the manufacturing method of the display panel provided by the embodiment of the present invention, after forming the second contact hole and the second via hole by the same second patterning process, the step S20 further includes: forming a first source and drain metal layer on the second interlayer dielectric layer, wherein the first source and drain metal layer is connected to the second active layer through the first contact hole, and the first source and drain metal layer is connected to the first active layer through the second contact hole.

According to the manufacturing method of the display panel provided by the embodiment of the present invention, after forming the first source and drain metal layer on the second interlayer dielectric layer, the manufacturing method further includes following steps: sequentially forming a passivation layer, a first planarization layer, and the second source and drain metal layer on the first source and drain metal layer, wherein the first planarization layer fills the first via hole and the second via hole, a third contact hole is formed on the first planarization layer, the second source and drain metal layer is connected to the first source and drain metal layer through the third contact hole; and sequentially forming a second planarization layer, an anode, a pixel defining layer, a light-emitting layer, and spacers on the second source and drain metal layer, a fourth contact hole is formed on the second planarization layer, and the anode is connected to the second source and drain metal layer through the fourth contact hole.

An embodiment of the present invention provides a display panel including a display area and a non-display area surrounding the display area, and the display panel includes: a base substrate; and silicon transistors and oxide semiconductor transistors positioned on the base substrate, and a first via hole and a second via hole communicated with each other, wherein the silicon transistors and the oxide semiconductor transistors are positioned in the display area, and the first via hole and the second via hole are positioned in the non-display area; and wherein the silicon transistors are positioned in the first film layer group, and the oxide semiconductor transistors are positioned in the second film layer group, the first film layer group and the second film layer group are sequentially disposed on the base substrate, the oxide semiconductor transistors include a first contact hole, the first contact hole penetrates at least the second film layer group, the first via hole penetrates the second film layer group, and a depth of the first contact hole is equal to a depth of the first via hole.

According to the display panel provided by the embodiment of the present invention, the silicon transistors and the oxide semiconductor transistors include a second contact hole, the second contact hole penetrates the first film layer group and at least a portion of the second film layer group, the second via hole penetrates the second film layer group, and a depth of the second contact hole is equal to a depth of the second via hole.

According to the display panel provided by the embodiment of the present invention, the first film layer group includes a barrier layer, a buffer layer, a first active layer, a first gate insulating layer, a first gate layer, a second gate insulating layer, a second gate layer, and a first interlayer dielectric layer sequentially disposed on the base substrate; the second film layer group includes a second active layer, a third gate insulating layer, a third gate layer, and a second interlayer dielectric layer sequentially disposed on the first interlayer dielectric layer; wherein the first contact hole and the first via hole penetrate the second interlayer dielectric layer and the third gate insulating layer, the second contact hole penetrates the second interlayer dielectric layer, the third gate insulating layer, the first interlayer dielectric layer, the second gate insulating layer, the first gate insulating layer, the first active layer, and the buffer layer, and the second via hole penetrates the first interlayer dielectric layer, the second gate insulating layer, the first gate insulating layer, the buffer layer, and the barrier layer.

According to the display panel provided by an embodiment of the present invention, a first source and drain metal layer is disposed on the second interlayer dielectric layer, and the display panel further includes a passivation layer, a first planarization layer, and a second source and drain metal layer disposed on the first source and drain metal layer.

According to the display panel provided by an embodiment of the present invention, a hole diameter of the first via hole is larger than a hole diameter of the second via hole, and the hole diameter of the first via hole and the hole diameter of the second via hole gradually become smaller along a direction from the second interlayer dielectric layer to the base substrate.

According to the display panel provided by an embodiment of the present invention, the base substrate includes a first flexible layer, a second flexible layer, and an inorganic layer disposed between the first flexible layer and the second flexible layer.

In the display panel and manufacturing method thereof provided by the present invention, the first contact hole for connecting the source and drain metal layer of the oxide semiconductor transistor and the second active layer, and the first via hole are formed by the same patterning process and the same photomask; and the second contact hole for connecting the source and drain metal layer of the silicon transistor and the first active layer, and the second via hole are formed by the same patterning process and the same photomask. Therefore, compared with the prior art, the manufacturing process of the display panel can save at least two patterning processes, thereby simplifying the process of the display panel, reducing the production cost, and improving the product yield.

DESCRIPTION OF DRAWINGS

In order to explain the embodiments or the technical solutions in the prior art more clearly, the following will briefly introduce the drawings that are used in the description of the embodiments or in the prior art. Obviously, the drawings in the description are only some embodiments of the invention. For those of ordinary skill in the art, other drawings can be obtained based on these drawings without creative work.

FIG. 1 is a flowchart of a method of manufacturing a display panel according to an embodiment of the present invention.

FIG. 2 is a flowchart of step S20 in a method of manufacturing a display panel according to an embodiment of the present invention.

DETAILED DESCRIPTION OF PREFERRED EMBODIMENTS

Figure 3A:
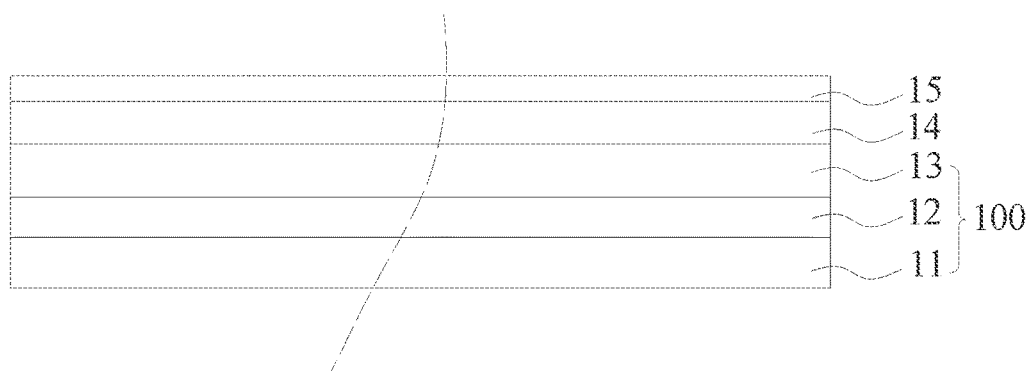
FIG. 3A to FIG. 3G are schematic diagrams of structures of a display panel in a process of a method of manufacturing a display panel according to an embodiment of the present invention.

The description of the following embodiments refers to the drawings to illustrate specific embodiments in which the present invention can be implemented. The directional terms mentioned in the present invention, such as "above", "below", "front", "back", 'left', 'right', "inner", "outer", "side", etc., are only directions referring to the drawings. Therefore, the directional terms are used to describe and understand the present invention, rather than to limit the present invention. In the drawing, units with similar structures are indicated by the same reference numerals.

The present invention is directed at a display panel in the prior art and a manufacturing method thereof. Due to the complicated manufacturing process of the low-temperature polycrystalline oxide (LTPO) display panel, the yield rate is low, and the manufacturing cost is high. This embodiment can solve this problem.

Please refer to FIG. 1, the manufacturing method of the display panel provided by the embodiments of the present invention includes following steps:

Step S10: Providing a base substrate 100 which includes a display area A and a non-display area B surrounding the display area A.

Step S20, forming a silicon transistor 200 and an oxide semiconductor transistor 300 in the display area A of the base substrate 100 and forming a first via hole 201 and a second via hole 202 connected to each other in the non-display area B, wherein the silicon transistor 200 is positioned in a first film layer group 1, and the oxide semiconductor transistor 300 is positioned in a second film layer group 2.

As shown in FIG. 2, the step S20 includes following steps:

Step S201: sequentially forming the first film layer group 1 and the second film layer group 2 on the base substrate 100; and Step S202: forming a first contact hole 101 penetrating at least a portion of the second film layer group 2 and the first via hole 201 penetrating the second film layer group 2 by same first patterning process.

Because the first contact hole 101 and the first via hole 201 are both formed in the second film layer group 2, and their depths are almost equal, the first contact hole 101 and the first via hole 201 are formed by same patterning process and the same photomask. Compared with the prior art, in a manufacturing process of the display panel, one patterning process can be saved.

Further, the step S20 includes following steps: step S203: forming a second contact hole 102 penetrating the first film layer group 1 and at least a portion of the second film layer group 2, and the second via hole 202 penetrating the second film layer group 2 by same second patterning process.

Because depths of the second contact hole 102 and the second via hole 202 are almost equal, the second contact hole 102 and the second via hole 202 are formed by the same patterning process and same photomask. Compared with the prior art, in a manufacturing process of the display panel, one patterning process can be saved.

Specifically, the step S201 includes following steps:

A barrier layer 14 and a buffer layer 15 are sequentially formed on the base substrate 100.

Specifically, as shown in FIG. 3A, the barrier layer 14 is positioned on the base substrate 100, and the buffer layer 15 is positioned on the barrier layer 14. The material used for the barrier layer 14 includes one or more of silicon oxide, silicon nitride, silicon oxynitride, or amorphous silicon and is mainly used to block water and oxygen and prevent external water vapor or oxygen from corroding the display panel. The material used for the buffer layer 15 includes at least one of silicon nitride or silicon oxide and mainly functions as a buffer and protection.

Alternatively, the base substrate 100 includes a first flexible layer 11, a second flexible layer 13, and an inorganic layer 12 disposed between the first flexible layer 11 and the second flexible layer 13. The inorganic layer 12 is used to block water and oxygen on the one hand, and on the other hand to prevent laser from damaging the first flexible layer 11 and the second flexible layer 13 during laser peeling.

A first active layer 16, a first gate insulating layer 17, a first gate layer 18, a second gate insulating layer 19, a second gate layer 20, and a first interlayer dielectric layer 21 of the silicon transistor 200 are sequentially formed on the buffer layer 15 to obtain the first film layer group.

Figure 3B:
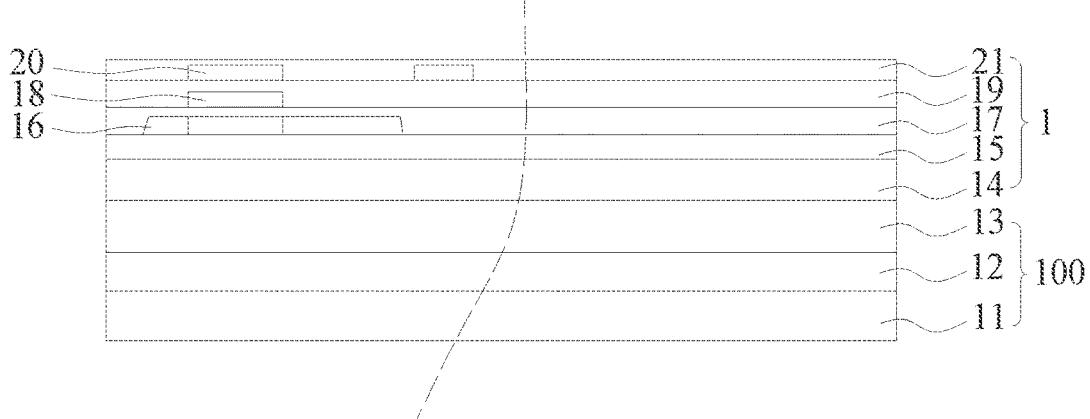

Specifically, as shown in FIG. 3B, the first active layer 16 is patterned and formed on a side of the buffer layer 15 away from the base substrate 100, and a material of the first active layer 16 is low-temperature polysilicon. The first gate insulating layer 17 covers the first active layer 16, and the first gate layer 18 is patterned and formed on a side of the first gate insulating layer 17 away from the base substrate 100. The second gate insulating layer 19 covers the first gate layer 18, the second gate layer 20 is patterned and formed on the second gate insulating layer 19, and the first interlayer dielectric layer 21 covers the second gate layer 20.

A second active layer 22, a third gate insulating layer 23, a third gate layer 24, and a second interlayer dielectric layer 25 of the oxide semiconductor transistor 300 are sequentially formed on the first interlayer dielectric layer 21 to obtain the second film layer group.

Figure 3C:
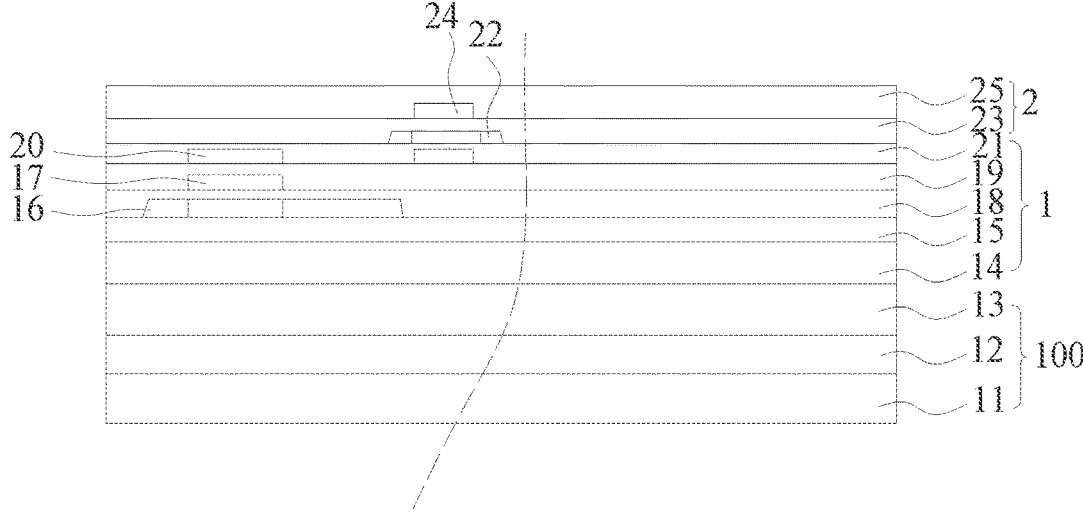

Specifically, as shown in FIG. 3C, the second active layer 22 is patterned and formed on a side of the first interlayer dielectric layer 21 away from the base substrate 100, and a material of the second active layer 22 is metal oxide. The third gate insulating layer 23 covers the second active layer 22, the third gate layer 24 is patterned and formed on a side of the third gate insulating layer 23 away from the base substrate 100, and the second interlayer dielectric layer 25 covers the third gate layer 24.

Wherein, the first contact hole 101 and the first via hole 201 formed by the same first patterning process penetrate the second interlayer dielectric layer 25 and the third gate insulating layer 23. The second contact hole 102 formed by the same second patterning process penetrates the second interlayer dielectric layer 25, the third gate insulating layer 23, the first interlayer dielectric layer 21, the second gate insulating layer 19, and the first gate insulating layer 17. The second via hole 202 formed by the same second patterning process penetrates the first interlayer dielectric layer 21, the second gate insulating layer 19, the first gate insulating layer 17, the buffer layer 15, and the barrier layer 14.

Forming the first contact hole 101 and the first via hole 201 by the same first patterning process includes following steps:

A first photoresist layer is formed on the second interlayer dielectric layer 25;

Sequentially performing exposure, development, and etching on the first photoresist layer to obtain the first contact hole 101 and the first via hole 201 penetrating the second interlayer dielectric layer 25 and the third gate insulating layer 23; and Stripping off a remaining portion of the first photoresist layer.

Figure 3D:
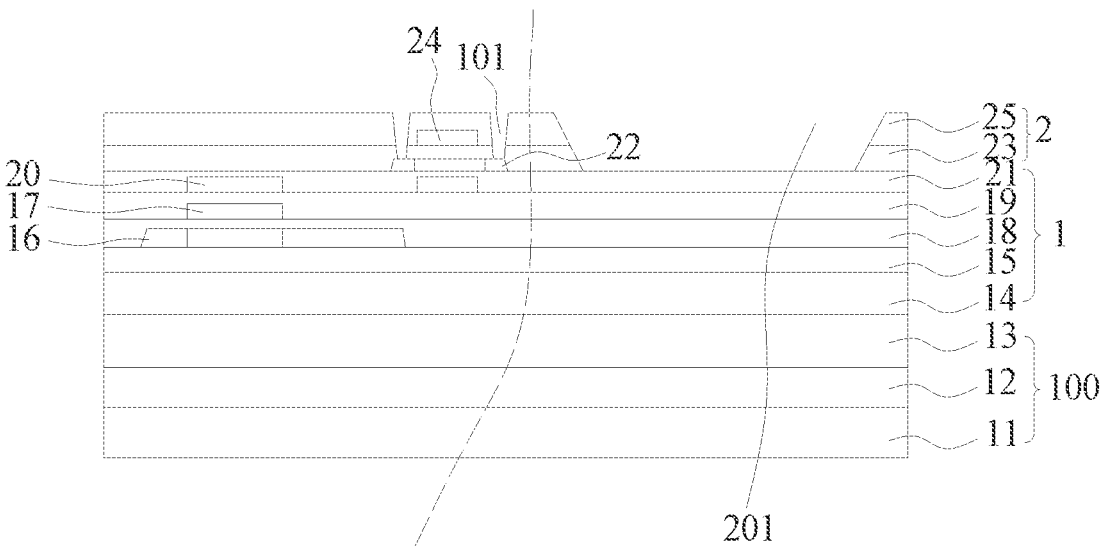

Specifically, as shown in FIG. 3D, to form the first contact hole 101 and the first via hole 201, the second interlayer dielectric layer 25 and the third gate insulating layer 23 need to be etched successively. Because a thickness of the second active layer 22 is very small, thicknesses of the film layer that needs to be etched to form the first contact hole 101 and the first via hole 201 are almost same and are equivalent to the sum of the thicknesses of the second interlayer dielectric layer 25 and the third gate insulating layer 23. Therefore, in the embodiments of the present invention, the first contact hole 101 and the first via hole 201 may be formed by same patterning process. The second active layer 22 has a function of blocking etching, so the etching process in the patterning process stops when the second active layer 22 is etched. The third gate insulating layer 23 does not have the effect of blocking etching, so the etching process in the patterning process stops when the second interlayer dielectric layer 25 is etched.

Compared with the first contact hole 101 and the first via hole 201 in the prior art that are made of different photomasks, this step can reduce one patterning process, reduce production costs, and improve product yield.

A bottom of the first contact hole 101 contacts a side of the second active layer 22 away from the base substrate 100. A bottom of the first via hole 201 contacts a side of the first interlayer dielectric layer 21 away from the base substrate 100. An angle between a sidewall of the first contact hole 101 and a first direction is between 50° and 80°. An angle between a sidewall of the first via hole 201 and the first direction is between 30° and 60°, wherein the first direction is a horizontal direction perpendicular to a thickness direction of the display panel.

Further, forming the second contact hole 102 and the second via hole 202 by same second patterning process includes following steps:

A second photoresist layer is formed on the second interlayer dielectric layer 25 and an inner sidewall of the first via hole 201.

Sequentially performing exposure, development, and etching on the second photoresist layer to form the second contact hole 102 penetrating the second interlayer dielectric layer 25, the third gate insulating layer 23, the first interlayer dielectric layer 21, the second gate insulating layer 19, the first gate insulating layer 17, and the buffer layer 15, and the second via hole 202 penetrating the first interlayer dielectric layer 21, the second gate insulating layer 19, the first gate insulating layer 17, the buffer layer 15, and the barrier layer 14; and stripping off a remaining portion of the second photoresist layer.

Figure 3E:
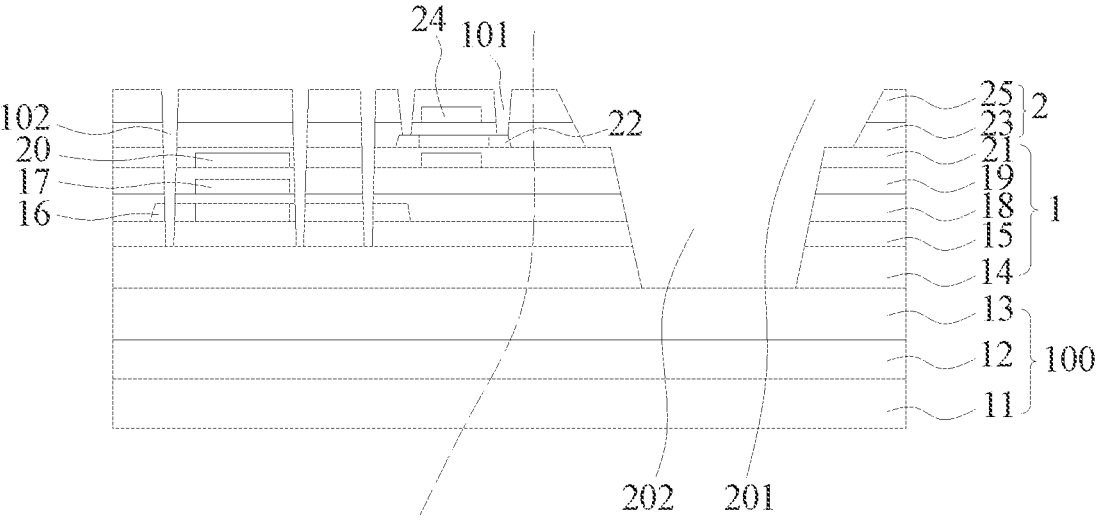

Specifically, as shown in FIG. 3E, similar to step S203, forming the second via hole 202 requires sequentially etching the second interlayer dielectric layer 25, the third gate insulating layer 23, the first interlayer dielectric layer 21, the second gate insulating layer 19, the first gate insulating layer 17, the buffer layer 15, and the barrier layer 14. Because a thickness of the barrier layer 14 is equal to a thickness of the second interlayer dielectric layer 25 and a thickness of the third gate insulating layer 23, a thickness of the film layer to be etched to form the second contact hole 102 and the second via hole 202 is almost same. Specifically, a thickness of the film layer required to be etched to form the second contact hole 102 is between 1100 nm and 1350 nm, and a thickness of the film layer required to be etched to form the second via hole 202 is between 1100 nm and 1350 nm. Therefore, the second contact hole 102 can be formed by sequentially etching the second interlayer dielectric layer 25, the third gate insulating layer 23, the first interlayer dielectric layer 21, the second gate insulating layer 19, the first gate insulating layer 17, the first active layer 16, and the buffer layer 15. Therefore, in the embodiments of the present invention, the second contact hole 102 and the second via hole 202 may be formed by the same patterning process. When the second contact hole 102 is formed, the etching process in the patterning process stops when the barrier layer 14 is etched. When the second via 202 is formed, the etching process in the patterning process stops when the second flexible layer 13 of the base substrate 100 is etched.

Similarly, compared with the second contact hole 102 and the second via hole 202 in the prior art that are formed by different photomasks, this step can reduce one patterning process, reduce production costs, and improve product yield.

Specifically, a bottom of the second contact hole 102 contacts a side of the barrier layer 14 away from the base substrate 100, and a bottom of the second via hole 202 contacts a side of the barrier layer 14 close to the base substrate 100. An angle formed by a sidewall of the second contact hole 102 and the first direction is between 50° and 80°, and an angle formed by a sidewall of the second via hole 202 and the first direction is between 25° and 55°.

In the embodiments of the present invention, the first via hole 201 and the second via hole 202 are connected to each other, which can be used to remove a portion of the inorganic insulating material of the display panel and improve the bending resistance of the display panel. Wherein, a hole diameter of the first via hole 201 is larger than a hole diameter of the second via hole 202, and the hole diameter of the first via hole 201 and the hole diameter of the second via hole 202 gradually become smaller along a direction from the second interlayer dielectric layer 25 to the base substrate 100. A step surface is formed between the first via hole 201 and the second via hole 202, and the step surface is positioned on a side of the first interlayer dielectric layer 21 away from the base substrate 100. Because an edge of the step surface is relatively smooth, it is not only convenient for the wiring of the first source and drain metal layer 26 formed later, but also the step surface can clearly distinguish the two etching processes in step S20.

After forming the second contact hole and the second via hole by the same second patterning process, the step S20 further includes: forming a first source and drain metal layer 26 on the second interlayer dielectric layer 25, wherein the first source and drain metal layer 26 is connected to the second active layer 22 through the first contact hole 101, and the first source and drain metal layer 26 is connected to the first active layer 16 through the second contact hole 102.

Figure 3F:
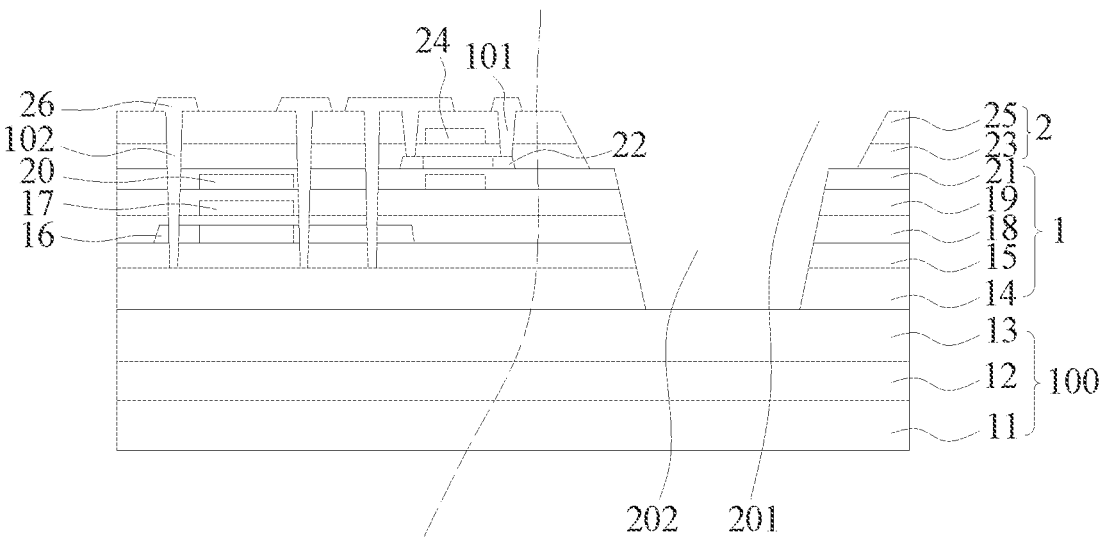

Specifically, as shown in FIG. 3F, the first source-drain metal layer 26 is patterned on a side of the second interlayer dielectric layer 25 away from the base substrate 100. The first source-drain metal layer 26 includes a first source and a first drain of the silicon transistor 200, and the number of the second contact holes 102 in each group is three. The first source electrode is connected to the first active layer 16 through one of the second contact holes 102, and the first drain electrode is connected to the first active layer 16 through one of the second contact holes 102. Similarly, the first source-drain metal layer 26 also includes a second source and a second drain of the oxide semiconductor transistor 300, and the second source is connected to the first active layer 16 through another second contact hole 102. A number of the first contact holes 101 in each group is two, the second source is connected to the second active layer 22 through one of the first contact holes 101, and the second drain is connected to the second active layer 22 through another first contact hole 101.

In the embodiments of the present invention, the first source and the first drain, as well as the second source and the second drain, are positioned in the same metal layer and can be formed by same process, which can simplify the process.

Figure 3G:
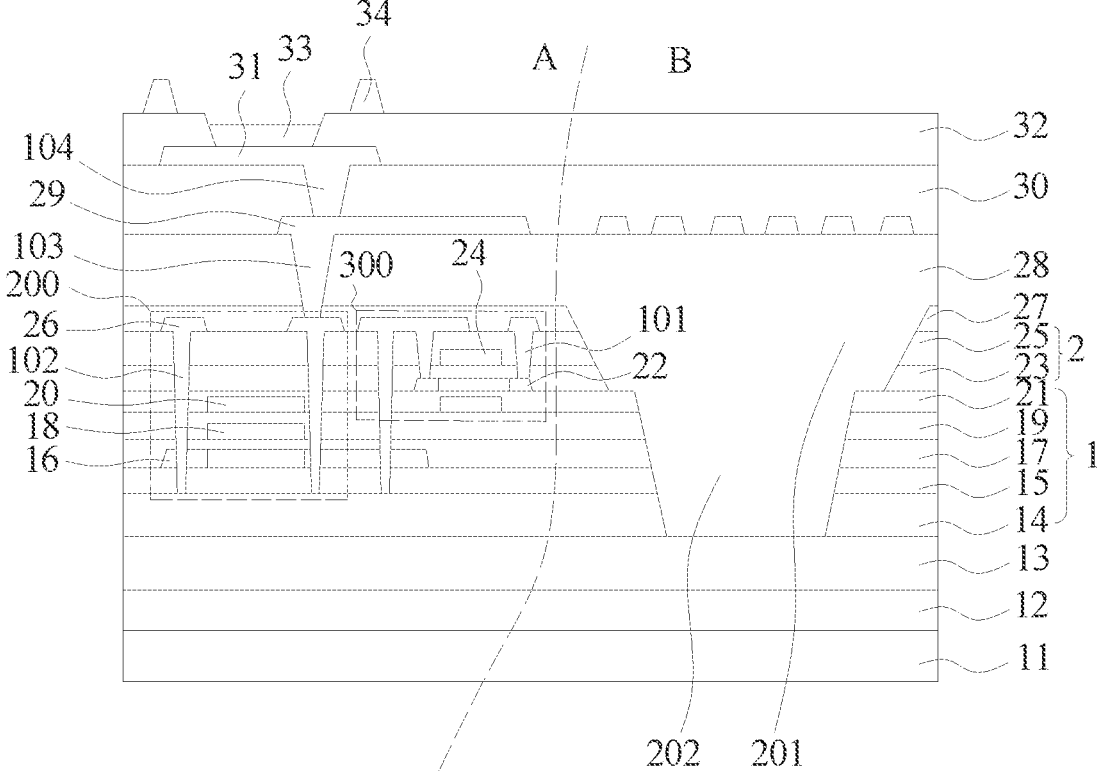

Further, as shown in FIG. 3G, after the first source and drain metal layer 26 is formed on the second interlayer dielectric layer 25, the manufacturing method further includes following steps:

Sequentially forming a passivation layer 27, a first planarization layer 28, and the second source and drain metal layer 29 on the first source and drain metal layer 26, wherein the first planarization layer 28 fills the first via hole 201 and the second via hole 202, a third contact hole 103 is formed on the first planarization layer 28, the second source and drain metal layer 29 is connected to the first source and drain metal layer 26 through the third contact hole 26; and Sequentially forming a second planarization layer 30, an anode 31, a pixel defining layer 32, a light-emitting layer 33, and spacers 34 on the second source and drain metal layer 29; a fourth contact hole 104 is formed on the second planarization layer 30; and the anode 31 is connected to the second source and drain metal layer 29 through the fourth contact hole 104.

Specifically, the second source and drain metal layer 29 is connected to the first drain through the third contact hole 103. The first planarization layer 28 and the second planarization layer 30 are made of flexible materials. The first planarization layer 28 is filled in the first via hole 201 and the second via hole 202 to prevent the metal lines positioned in the bending area from being broken. An orthographic projection of the second source and drain metal layer 29 on the base substrate 100 covers an orthographic projection of the second active layer 22 on the base substrate 100. In this way, the second source and drain metal layer 29 serves to shield light and ions for the second active layer 22, so as to avoid the occurrence of undesirable situations.

In addition, the characteristics of the second active layer 22 can be ensured by improving the film-forming process and the annealing process of the second interlayer dielectric layer 25. Thus, the above step of forming a passivation layer on the first source and drain metal layer 26 can be eliminated, which can further reduce one patterning process.

Figure 4:
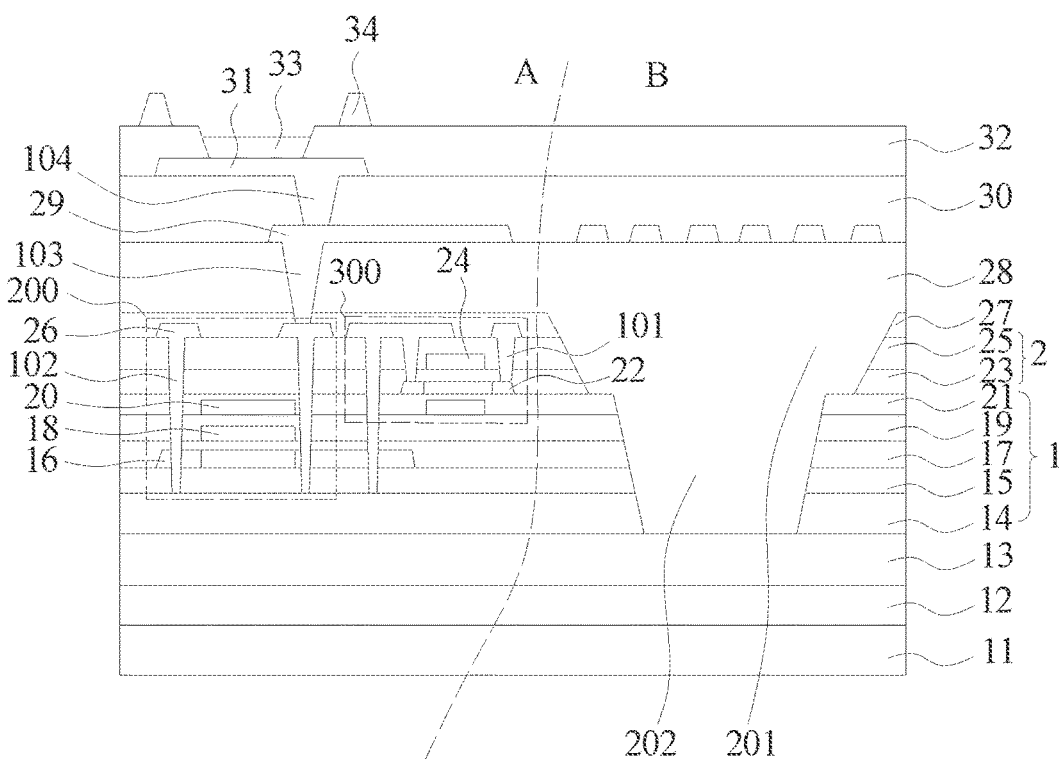
FIG. 4 is a schematic diagram of a cross-sectional structure of a display panel provided by an embodiment of the present invention.

Please refer to FIG. 4, the display panel provided by the embodiments of the present invention is manufactured by the method of manufacturing the display panel provided in the above-mentioned embodiments. The display panel includes a display area A and a non-display area B surrounding the display area A. The non-display area B can be bent to the back of the display panel to reduce the lower frame of the display panel, which is beneficial to increasing the screen-to-body ratio and facilitate full-screen display.

The display panel includes a base substrate 100, a silicon transistor 200, an oxide semiconductor transistor 300, a first via hole 201, and a second via hole 202.

The silicon transistor 200 and the oxide semiconductor transistor 300 are disposed on the base substrate 100, wherein, the silicon transistor 200 and the oxide semiconductor transistor 300 are positioned in the display area A, and the first via hole 201 and the second via hole 202 are both positioned in the bending area B. Because a threshold voltage of the silicon transistor 200 does not drift, it can be used as a driving transistor, and because the oxide semiconductor transistor 300 has good switching performance, it can be used as a switching transistor.

Wherein, the silicon transistor 200 is positioned in the first film layer group 1, and the oxide semiconductor transistor 300 is positioned in the second film layer group 2. The first film layer group 1 and the second film layer group 2 are sequentially disposed on the base substrate 100. The oxide semiconductor transistor 300 includes a first contact hole 101, and the first contact hole 101 penetrates at least the second film layer group 2. The first via hole 201 penetrates the second film layer group 2. A depth of the first contact hole 101 is equal to a depth of the first via hole 201.

Further, the silicon transistor 200 and the oxide semiconductor transistor 300 include a second contact hole 102, the second contact hole 102 penetrates the first film layer group 1 and at least a portion of the second film layer group 2. The second via hole 202 penetrates the second film layer group 2, and a depth of the second contact hole 102 is equal to a depth of the second via hole 202.

The first film layer group 1 includes a barrier layer 14, a buffer layer 15, a first active layer 16, a first gate insulating layer 17, a first gate layer 18, a second gate insulating layer 19, a second gate layer 20, and a first interlayer dielectric layer 21, which are sequentially disposed on the base substrate. The second film layer group 2 includes a second active layer 22, a third gate insulating layer 23, a third gate layer 24, and a second interlayer dielectric layer 25, which are sequentially disposed on the first interlayer dielectric layer 21.

Wherein, the first contact hole 101 and the first via hole 201 penetrate the second interlayer dielectric layer 25 and the third gate insulating layer 23, the second contact hole 102 penetrates the second interlayer dielectric layer 25, the third gate insulating layer 23, the first interlayer dielectric layer 21, the second gate insulating layer 19, and the first gate insulating layer 17, the first active layer 16, and the buffer layer 15; and the second via hole 202 penetrates the first interlayer dielectric layer 21, the second gate insulating layer 19, the first gate insulating layer 17, the buffer layer 15, and the barrier layer 14.

Wherein, the silicon transistor 200 in the embodiment of the present invention adopts a double gate structure and includes a first active layer 16, a first gate insulating layer 17, a first gate layer 18, a second gate insulating layer 19, a second gate layer 20, and a first interlayer dielectric layer 21 that are sequentially disposed on the buffer layer 15. The oxide semiconductor transistor 300 includes a second active layer 22, a third gate insulating layer 23, a third gate layer 24, and a second interlayer dielectric layer 25 that are sequentially disposed on the first interlayer dielectric layer 21. The second interlayer dielectric layer 25 is provided with a first source and drain metal layer 26, the first source and drain metal layer 26 is connected to the second active layer 22 through the first contact hole 101, and the first source and drain metal layer 26 is connected to the first active layer 16 through the second contact hole 102.

Specifically, the first source and drain metal layer 26 includes a first source and a first drain of the silicon transistor 200. A number of the second contact holes 102 in each group is three, the first source is connected to the first active layer 16 through one of the second contact holes 102, and the first drain is connected to the first active layer 16 through one of the second contact holes 102. Similarly, the first source and drain metal layer 26 also includes a second source and a second drain of the oxide semiconductor transistor 300, the second source is connected to the first active layer 16 through another second contact hole 102. A number of the first contact holes 101 in each group is two, the second source is connected to the second active layer 22 through one of the first contact holes 101, and the second drain is connected to the second active layer 22 through another first contact hole 101.

The first via hole 201 and the second via hole 202 are connected to each other. The first contact hole 101 and the first via hole 201 penetrate the second interlayer dielectric layer 25 and the third gate insulating layer 23. The second contact hole 102 penetrates the second interlayer dielectric layer 25, the third gate insulating layer 23, the first interlayer dielectric layer 21, the second gate insulating layer 19, the first gate insulating layer 17, the first active layer 16, and the buffer layer 15, and the second via hole 202 penetrates the first interlayer dielectric layer 21, the second gate insulating layer 19, the first gate insulating layer 17, the buffer layer 15, and the barrier layer 14. The first contact hole 101 and the first via hole 201 can be formed by the same patterning process, and the second contact hole 102 and the second via hole 202 can be formed by the same patterning process. Compared with the prior art, it can reduce two patterning processes, reduce production costs, and improve product yield.

Specifically, the bottom of the first contact hole 101 contacts a side of the second active layer 22 away from the base substrate 100, and the bottom of the second contact hole 102 contacts a side of the buffer layer 15 away from the base substrate 100. The bottom of the first via hole 201 contacts a side of the first interlayer dielectric layer 21 away from the base substrate 100, and the bottom of the second via hole 202 contacts a side of the barrier layer 14 close to the base substrate 100.

A hole diameter 201 of the first via hole 201 is larger than a hole diameter of the second via hole 202, and the hole diameter of the first via hole 201 and the hole diameter of the second via hole 202 gradually become smaller along a direction from the second interlayer dielectric layer 25 to the base substrate 100. A step surface is formed between the first via hole 201 and the second via hole 202, and the step surface is positioned on a side of the first interlayer dielectric layer 21 away from the base substrate 100.

The display panel further includes a passivation layer 27, a first planarization layer 28, and a second source and drain metal layer 29 sequentially disposed on the first source and drain metal layer 26. The passivation layer 27 covers the second interlayer dielectric layer 25 and the first source and drain metal layer 26, and the first planarization layer 28 is filled in the first via hole 201 and the second via hole 202. A second planarization layer 30, an anode 31, a pixel defining layer 32, a light-emitting layer 33, and a plurality of spacers 34 are sequentially disposed on the second source and drain metal layer 29. The pixel defining layer 32 covers the anode 31, a groove exposing the anode 31 is provided on the pixel defining layer 32, the light-emitting layer 33 is disposed in the groove, and a plurality of spacers 34 are disposed at intervals on a side of the pixel defining layer 32 away from the base substrate 100. The second source and drain metal layer 29 is connected to the first source and drain metal layer 26 through a third contact hole 103 penetrating the first planarization layer 28, and the anode 31 is connected to the second source and drain metal layer 29 through a fourth contact hole 104 penetrating the second planarization layer 30.

Figure 5:
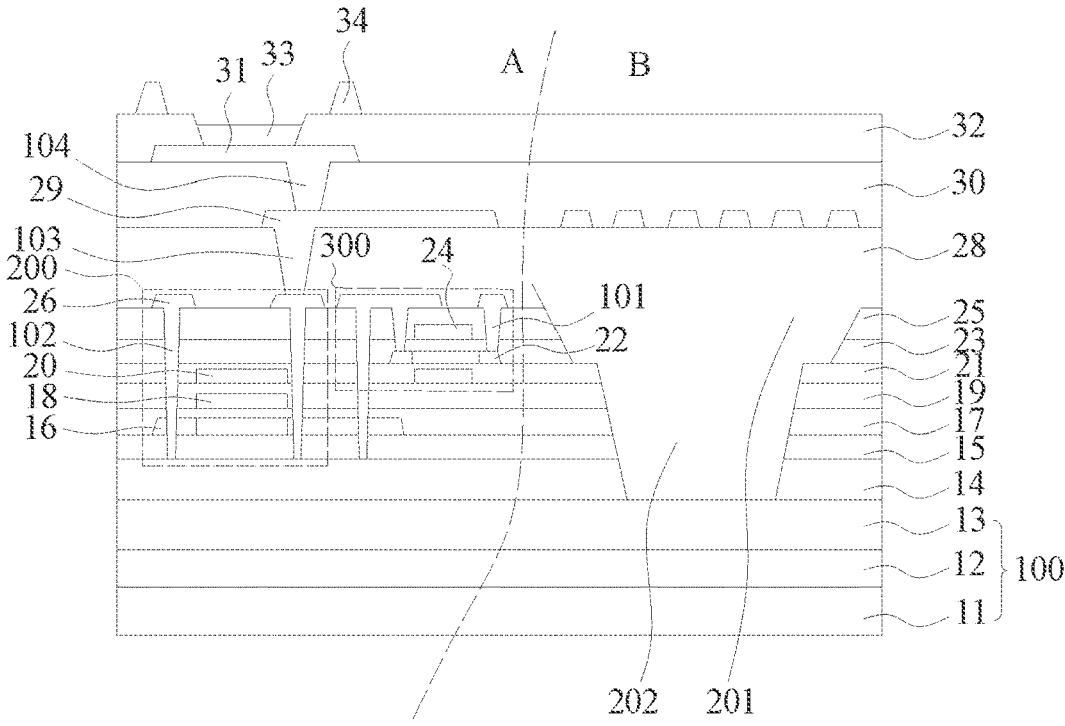
FIG. 5 is a schematic diagram of a cross-sectional structure of a display panel provided by an embodiment of the present invention.

Further, as shown in FIG. 5, a difference between the display panel provided in FIG. 5 and the display panel provided in FIG. 4 is that the passivation layer 27 is omitted, and an overall thickness of the display panel is reduced. Specifically, the characteristics of the second active layer 22 can be ensured by improving the film-forming process and the annealing process of the second interlayer dielectric layer 25.

The beneficial effect is that in the display panel and manufacturing method thereof provided by the present invention, the first contact hole for connecting the source and drain metal layer of the oxide semiconductor transistor and the second active layer, and the first via hole are formed by the same patterning process and the same photomask; and the second contact hole for connecting the source and drain metal layer of the silicon transistor and the first active layer, and the second via hole are formed by the same patterning process and the same photomask. Therefore, compared with the prior art, the manufacturing process of the display panel can save at least two patterning processes, thereby simplifying the process of the display panel, reducing the cost, and improving the yield.

As described above, the present invention has been disclosed in a preferred embodiment. However, the above-mentioned preferred embodiments are not intended to limit the present invention. Those of ordinary skill in the art can make various changes and modifications without departing from the spirit and scope of the present invention. Therefore, the protection scope of the present invention is subject to the scope defined by the claims.

What is claimed is:

1. A manufacturing method of a display panel, the display panel comprising a display area and a non-display area surrounding the display area, the manufacturing method of the display panel comprising:

providing a base substrate, the base substrate comprising a first flexible layer, a second flexible layer, and an inorganic layer disposed between the first flexible layer and the second flexible layer; and forming a silicon transistor and an oxide semiconductor transistor in the display area of the base substrate and forming a first via hole and a second via hole communicating with each other in the non-display area of the base substrate, wherein the silicon transistor is positioned in a first film layer group, and the oxide semiconductor transistor is positioned in a second film layer group; and wherein forming the silicon transistor and the oxide semiconductor transistor in the display area of the base substrate and forming the first via hole and the second via hole communicating with each other in the non-display area of the base substrate comprise:

sequentially forming the first film layer group and the second film layer group on the base substrate; and forming a first contact hole penetrating at least a portion of the second film layer group and the first via hole penetrating the second film layer group by same first patterning process.

2. The manufacturing method of the display panel according to claim 1, wherein forming the silicon transistor and the oxide semiconductor transistor in the display area of the base substrate and forming the first via hole and the second via hole communicating with each other in the non-display area of the base substrate further comprise:

forming a second contact hole penetrating the first film layer group and at least a portion of the second film layer group and the second via hole penetrating the second film layer group by same second patterning process.

3. The manufacturing method of the display panel according to claim 2, wherein sequentially forming the first film layer group and the second film layer group on the base substrate comprises:

sequentially forming a barrier layer and a buffer layer on the base substrate;

sequentially forming a first active layer, a first gate insulating layer, a first gate layer, a second gate insulating layer, a second gate layer, and a first interlayer dielectric of the silicon transistor on the buffer layer to obtain the first film layer group; and sequentially forming a second active layer, a third gate insulating layer, a third gate layer, and a second interlayer dielectric layer of the oxide semiconductor transistor on the first interlayer dielectric layer to obtain the second film group;

wherein, the first contact hole and the first via hole formed by same first patterning process penetrate the second interlayer dielectric layer and the third gate insulating layer; the second contact hole formed by same second patterning process penetrates the second interlayer dielectric layer, the third gate insulating layer, the first interlayer dielectric layer, the second gate insulating layer, the first gate insulating layer, and the buffer layer; and the second via hole formed by the same second patterning process penetrates the first interlayer dielectric layer, the second gate insulating layer, the first gate insulating layer, the buffer layer, and the barrier layer.

4. The manufacturing method of the display panel according to claim 3, wherein forming the first contact hole and the first via hole by the same first patterning process comprises:

forming a first photoresist layer on the second interlayer dielectric layer;

sequentially performing exposure, development, and etching on the first photoresist layer to obtain the first contact hole and the first via hole penetrating the second interlayer dielectric layer and the third gate insulating layer; and stripping off a remaining portion of the first photoresist layer.

5. The manufacturing method of the display panel according to claim 3, wherein forming the second contact hole and the second via hole by the same second patterning process comprises:

forming a second photoresist layer on the second interlayer dielectric layer and an inner sidewall of the first via hole;

sequentially performing exposure, development, and etching on the second photoresist layer to obtain the second contact hole penetrating the second interlayer dielectric layer, the third gate insulating layer, the first interlayer dielectric layer, the second gate insulating layer, the first gate insulating layer, and the buffer layer, and the second via hole penetrating the first interlayer dielectric layer, the second gate insulating layer, the first gate insulating layer, the buffer layer, and the barrier layer; and stripping off a remaining portion of the second photoresist layer.

6. The manufacturing method of the display panel according to claim 3, wherein after forming the second contact hole and the second via hole by the same second patterning process, forming the silicon transistor and the oxide semiconductor transistor in the display area of the base substrate and forming the first via hole and the second via hole communicating with each other in the non-display area of the base substrate further comprise: forming a first source and drain metal layer on the second interlayer dielectric layer, wherein the first source and drain metal layer is connected to the second active layer through the first contact hole, and the first source and drain metal layer is connected to the first active layer through the second contact hole.

7. The manufacturing method of the display panel according to claim 6, wherein after forming the first source and drain metal layer on the second interlayer dielectric layer, the manufacturing method further comprises:

sequentially forming a passivation layer, a first planarization layer, and the second source and drain metal layer on the first source and drain metal layer, wherein the first planarization layer fills the first via hole and the second via hole, a third contact hole is formed on the first planarization layer, and the second source and drain metal layer is connected to the first source and drain metal layer through the third contact hole; and sequentially forming a second planarization layer, an anode, a pixel defining layer, a light-emitting layer, and spacers on the second source and drain metal layer, a fourth contact hole is formed on the second planarization layer, and the anode is connected to the second source and drain metal layer through the fourth contact hole.

8. A manufacturing method of a display panel, the display panel comprising a display area and a non-display area surrounding the display area, the manufacturing method of the display panel comprising:

providing a base substrate; and forming a silicon transistor and an oxide semiconductor transistor on the base substrate and forming a first via hole and a second via hole connected to each other in the non-display area, wherein the silicon transistor is positioned in a first film layer group, and the oxide semiconductor transistor is positioned in a second film layer group; and wherein forming the silicon transistor and the oxide semiconductor transistor on the base substrate and forming the first via hole and the second via hole connected to each other in the non-display area comprise:

sequentially forming the first film layer group and the second film layer group on the base substrate; and forming a first contact hole penetrating at least a portion of the second film layer group and the first via hole penetrating the second film layer group by same first patterning process.

9. The manufacturing method of the display panel according to claim 8, wherein forming the silicon transistor and the oxide semiconductor transistor on the base substrate and forming the first via hole and the second via hole connected to each other in the non-display area further comprise:

forming a second contact hole penetrating the first film layer group and at least a portion of the second film layer group and the second via hole penetrating the second film layer group by same second patterning process.

10. The manufacturing method of the display panel according to claim 9, wherein sequentially forming the first film layer group and the second film layer group on the base substrate comprises: sequentially forming a barrier layer and a buffer layer on the base substrate;

sequentially forming a first active layer, a first gate insulating layer, a first gate layer, a second gate insulating layer, a second gate layer, and a first interlayer dielectric of the silicon transistor on the buffer layer to obtain the first film layer group; and sequentially forming a second active layer, a third gate insulating layer, a third gate layer, and a second interlayer dielectric layer of the oxide semiconductor transistor on the first interlayer dielectric layer to obtain the second film group;

wherein the first contact hole and the first via hole formed by the same first patterning process penetrate the second interlayer dielectric layer and the third gate insulating layer; the second contact hole formed by the same second patterning process penetrates the second interlayer dielectric layer, the third gate insulating layer, the first interlayer dielectric layer, the second gate insulating layer, the first gate insulating layer, and the buffer layer; and the second via hole formed by the same second patterning process penetrates the first interlayer dielectric layer, the second gate insulating layer, the first gate insulating layer, the buffer layer, and the barrier layer.

11. The manufacturing method of the display panel according to claim 10, wherein forming the first contact hole and the first via hole by the same first patterning process comprises:

forming a first photoresist layer on the second interlayer dielectric layer; sequentially performing exposure, development, and etching on the first photoresist layer to obtain the first contact hole and the first via hole penetrating the second interlayer dielectric layer and the third gate insulating layer; and stripping off a remaining portion of the first photoresist layer.

12. The manufacturing method of the display panel according to claim 10, wherein forming the second contact hole and the second via hole by the same second patterning process comprises:

forming a second photoresist layer on the second interlayer dielectric layer and an inner sidewall of the first via hole; sequentially performing exposure, development, and etching on the second photoresist layer to obtain the second contact hole penetrating the second interlayer dielectric layer, the third gate insulating layer, the first interlayer dielectric layer, the second gate insulating layer, the first gate insulating layer, and the buffer layer, and the second via hole penetrating the first interlayer dielectric layer, the second gate insulating layer, the first gate insulating layer, the buffer layer, and the barrier layer; and stripping off a remaining portion of the second photoresist layer.

13. The manufacturing method of the display panel according to claim 10, wherein after forming the second contact hole and the second via hole by the same second patterning process, forming the silicon transistor and the oxide semiconductor transistor on the base substrate and forming the first via hole and the second via hole connected to each other in the non-display area further comprise:

forming a first source and drain metal layer on the second interlayer dielectric layer, wherein the first source and drain metal layer is connected to the second active layer through the first contact hole, and the first source and drain metal layer is connected to the first active layer through the second contact hole.

14. The manufacturing method of the display panel according to claim 13, wherein after forming the first source and drain metal layer on the second interlayer dielectric layer, the manufacturing method further comprises:
sequentially forming a passivation layer, a first planarization layer, and the second source and drain metal layer on the first source and drain metal layer, wherein the first planarization layer fills the first via hole and the second via hole, a third contact hole is formed on the first planarization layer, the second source and drain metal layer is connected to the first source and drain metal layer through the third contact hole; and
sequentially forming a second planarization layer, an anode, a pixel defining layer, a light-emitting layer, and spacers on the second source and drain metal layer; a fourth contact hole is formed on the second planarization layer; and the anode is connected to the second source and drain metal layer through the fourth contact hole.

15. A display panel, comprising a display area and a non-display area surrounding the display area, the display panel comprising:

a base substrate; and one or more silicon transistors and one or more oxide semiconductor transistors positioned on the base substrate, and a first via hole and a second via hole connected to each other, wherein the silicon transistors and the oxide semiconductor transistors are positioned in the display area, and the first via hole and the second via hole are positioned in the non-display area; and wherein, the silicon transistors are positioned in the first film layer group, the oxide semiconductor transistors are positioned in the second film layer group, the first film layer group and the second film layer group are sequentially disposed on the base substrate, the oxide semiconductor transistors each comprise a first contact hole, the first contact hole penetrates at least the second film layer group, the first via hole penetrates the second film layer group, and a depth of the first contact hole is equal to a depth of the first via hole;

wherein the silicon transistors and the oxide semiconductor transistors each comprise a second contact hole, the second contact hole penetrates the first film layer group and at least a portion of the second film layer group, the second via hole penetrates the second film layer group, and a depth of the second contact hole is equal to a depth of the second via hole; and wherein a hole diameter of the first via hole is larger than a hole diameter of the second via hole, the hole diameter of the first via hole and the hole diameter of the second via hole gradually become smaller along a direction from the second film layer group toward the base substrate, and a minimum value of the hole diameter of the first via hole is greater than a maximum value of the hole diameter of the second via hole.

16. The display panel according to claim 15, wherein the base substrate comprises a first flexible layer, a second flexible layer, and an inorganic layer disposed between the first flexible layer and the second flexible layer.

17. The display panel according to claim 15, wherein the first film layer group comprises a barrier layer, a buffer layer, a first active layer, a first gate insulating layer, a first gate layer, a second gate insulating layer, a second gate layer, and a first interlayer dielectric layer sequentially disposed on the base substrate;

the second film layer group comprises a second active layer, a third gate insulating layer, a third gate layer, and a second interlayer dielectric layer sequentially disposed on the first interlayer dielectric layer;

wherein, the first contact hole and the first via hole penetrate the second interlayer dielectric layer and the third gate insulating layer; the second contact hole penetrates the second interlayer dielectric layer, the third gate insulating layer, the first interlayer dielectric layer, the second gate insulating layer, the first gate insulating layer, the first active layer, and the buffer layer; and the second via hole penetrates the first interlayer dielectric layer, the second gate insulating layer, the first gate insulating layer, the buffer layer, and the barrier layer.

18. The display panel according to claim 17, wherein a first source and drain metal layer is disposed on the second interlayer dielectric layer, and the display panel further comprises a passivation layer, a first planarization layer, and a second source and drain metal layer disposed on the first source and drain metal layer.

* * * * *

20